United States Patent
Karabatsos

(10) Patent No.: US 7,205,789 B1
(45) Date of Patent: Apr. 17, 2007

(54) TERMINATION ARRANGEMENT FOR HIGH SPEED DATA RATE MULTI-DROP DATA BIT CONNECTIONS

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 105 days.

(21) Appl. No.: 11/162,023

(22) Filed: Aug. 25, 2005

Related U.S. Application Data

(60) Provisional application No. 60/604,482, filed on Aug. 26, 2004.

(51) Int. Cl.
*H03K 17/16* (2006.01)
*G11C 7/10* (2006.01)

(52) U.S. Cl. .................... 326/30; 362/21; 365/189.01

(58) Field of Classification Search ............... 326/30, 326/113; 327/108
See application file for complete search history.

(56) References Cited

U.S. PATENT DOCUMENTS

| | | | | |
|---|---|---|---|---|
| 5,220,211 A | * | 6/1993 | Christopher et al. | 326/90 |
| 5,982,192 A | * | 11/1999 | Saito | 326/30 |
| 6,157,688 A | * | 12/2000 | Tamura et al. | 375/348 |
| 6,356,106 B1 | * | 3/2002 | Greeff et al. | 326/30 |
| 6,853,213 B2 | * | 2/2005 | Funaba | 326/30 |
| 6,937,111 B2 | * | 8/2005 | Kwon | 333/100 |
| 7,058,131 B2 | * | 6/2006 | Dreps et al. | 375/257 |

* cited by examiner

*Primary Examiner*—Vibol Tan
(74) *Attorney, Agent, or Firm*—Mark P. White

(57) ABSTRACT

A circuit for terminating devices attached to a signal line and driving a load includes a resistor R1 in series with the signal line circuit CR1 having a resistor in series with a switch wherein CR1 is in parallel with R1, a circuit CR2 having a resistor in series with a switch, connected at one end to Vcc and at the other to the load, a circuit CR3 having a resistor in series with a switch, connected at one end to Vcc and at the other to the load, a circuit CR4 having a resistor in series with a switch, connected at one end to ground and at the other to the load, a circuit CR5 having a resistor in series with a switch, connected at one end to Vcc and at the other to the load, and a capacitor connected between the receiver or transmitter and ground.

4 Claims, 5 Drawing Sheets

SWITCH ACTIVATION TABLE

| OPERATING MODE | S1 | S2 | S3 | S4 | S5 | CONTROLLER |
|---|---|---|---|---|---|---|
| ACTIVE – WRITE MODE | ON | ON | ON | ON | ON | OFF |
| ACTIVE – READ MODE | ON | OFF | OFF | OFF | OFF | 150 / 150 OHM |
| INACTIVE MODE | OFF | ON | ON | OFF | OFF | |

Example Values

R1 = 300   R4 = 300
R2 = 10    R5 = 300
R3 = 300   R6 = 300

TERMINATION ARRANGEMENT FOR HIGH SPEED DATA RATE MULTI-DROP DATA BIT CONNECTIONS

PROSECUTION HISTORY

This application claims priority based on Provisional Patent 60/604,482 (Aug. 26, 2004), for a "High Speed Termination Arrangement"

BACKGROUND OF INVENTION

The computer industry, with the advances of silicon technology, is constantly faced with the complexities of high speed Data Buses. The high speed of microprocessor CPUs requires a high speed data bus between the memory sub-system and the front end CPU data bus. However, speed without density of memory is an unbalanced combination. Modern computer systems require increasingly large RAM arrays, and these arrays are packaged in modules of approximately the same size as used in previous, lower capacity memories. Thus, the density of the memory modules, in bits or bytes per square inch of circuit board, is constantly increasing.

The CPU by itself cannot increase computer performance without a high speed memory sub-system and without such a high speed memory the CPU does not perform at the speed it was designed for. When memory access is substantially slower than CPU speed a bottleneck is created between memory and CPU Front End bus. With advances of the Internet, complex application programs and operating systems, memory sub-systems with high-density memory modules have become a necessity.

However, as the density of memory goes up above what a single memory chip can provide the capacitive loading of each data bit of the Data Bus increases. With the increase of the capacitive loading on the Data Bus, the driver of the data bit line is taxed for higher driving capability. As is well known, when the capacitive loading on a data line increases, the speed at which the corresponding driver circuit can change state on the data line decreases. Thus, on a given data line, the capacitive loading and the speed of data transfer are inversely proportional.

Many bus schemes have been designed to maximize speed in memory modules having increasing memory density. For that purpose, circuits utilizing pass gate switches have been designed into the data path to isolate and reduce the capacitive loading. Patents granted to the present inventor, Chris Karabatsos, include U.S. Pat. No. 6,446,158, U.S. Pat. No. 6,737,691, and U.S. Pat. No. 6,854,042, all intended to remedy this problem.

Data pulse widths in the nanosecond and sub nanosecond range are limited by high frequency data rates.

There are several factors to be considered in the design of such Bus circuits:

(a) Data bus widths must be broad enough to satisfy wide Data Bus requirements of the modern CPU.

(a) High Memory density must be maintained on the same Data Bus. That is, more Memory Modules are attached to the same Data Bus, and more connectors appear on the motherboard attached to the Bus.

The presence of parasitic Resistors, Inductors and Capacitors (RLC) in the structure of the Data Bus and on the devices, including Connectors, Memory modules, Printed circuit boards, Memory chips and logic chips connected to the Bus.

Effects of the physical RLC quantities affecting the overall speed by which data can be transported on the Bus and thus affecting the overall performance and bandwidth of such bus.

Synchronization of the Data signals and Strobe signals required to latch the data at the destination receiver.

Solutions to these problems in the prior art disclosed systems having dual data banks in which the data rate at each data bank is one-half the data rate at the memory subsystem bus, as described in inventions referenced above. However, further increases in computer speed have created synchronization and data capturing problems in the reading and writing of data between the system bus and the memory banks either directly or indirectly, as described in said prior art.

The present invention presents a radical improvement over the prior art by generating strobe signals and data signals which are synchronized with each other at both ends of the computer DATA BUS memory subsystem. One element is described herein that will allow the high speed reception and transmission of data bits and a termination scheme to reduce reflections and allow multi-drop memory data bit connections in the memory high speed subsystem.

The present invention provides a significant improvement in memory data rate speed and accuracy with substantial improvement in synchronization between the strobes and data in either direction of transmission and reception and better quality of signal over the prior art. It provides a termination arrangement for high speed data rate multi-drop data bit connections, described in the following description of the preferred embodiments of this invention.

SUMMARY OF THE INVENTION

It is an object of this invention to provide a termination circuit for devices connected to the data signal lines of electrical circuits to minimize reflected wave resulting from improper termination loads.

In accordance with one aspect of the invention a circuit for terminating devices attached to a signal line and driving a receiver or driver includes a resistor R1 in series with the signal line, a circuit CR1 comprising a resistor r2 in series with a switch s1, wherein CR1 is in parallel with R1, a circuit CR2 comprising a resistor R3 in series with switch S2, connected at one end to Vcc and at the other end to the receiver or driver, a circuit CR3 comprising a resistor R5 in series with switch S4, connected at one end to Vcc and at the other end to the receiver or driver, a circuit CR4 comprising a resistor R6 in series with switch S5, connected at one end to GND and at the other end to the receiver or driver, a circuit CR5 comprising a resistor R4 in series with switch S3, connected at one end to Vcc and at the other end to the receiver or driver, and a capacitor connected between the receiver or transmitter and ground.

In accordance with a second aspect of the invention, the circuit is configured in Write mode, wherein switch S1 is ON, switch S2 is ON, switch S3 is ON, switch S4 is ON, and switch S5 is ON.

In accordance with a third aspect of the invention, the circuit is configured Read mode, wherein switch S1 is ON, switch S1 is OFF, switch S1 is OFF, switch S1 is OFF, and switch S1 is OFF.

In accordance with a fourth aspect of the invention, the circuit is configured in Inactive mode, wherein switch S1 is OFF, switch S1 is ON, switch S1 is ON, switch S1 is OFF, and switch S1 is OFF.

BRIEF DESCRIPTION OF DRAWINGS

The invention will be more fully described in the following detailed description in conjunction with the drawings in which.

PREFERRED EMBODIMENT OF THE INVENTION

Figure 1A:
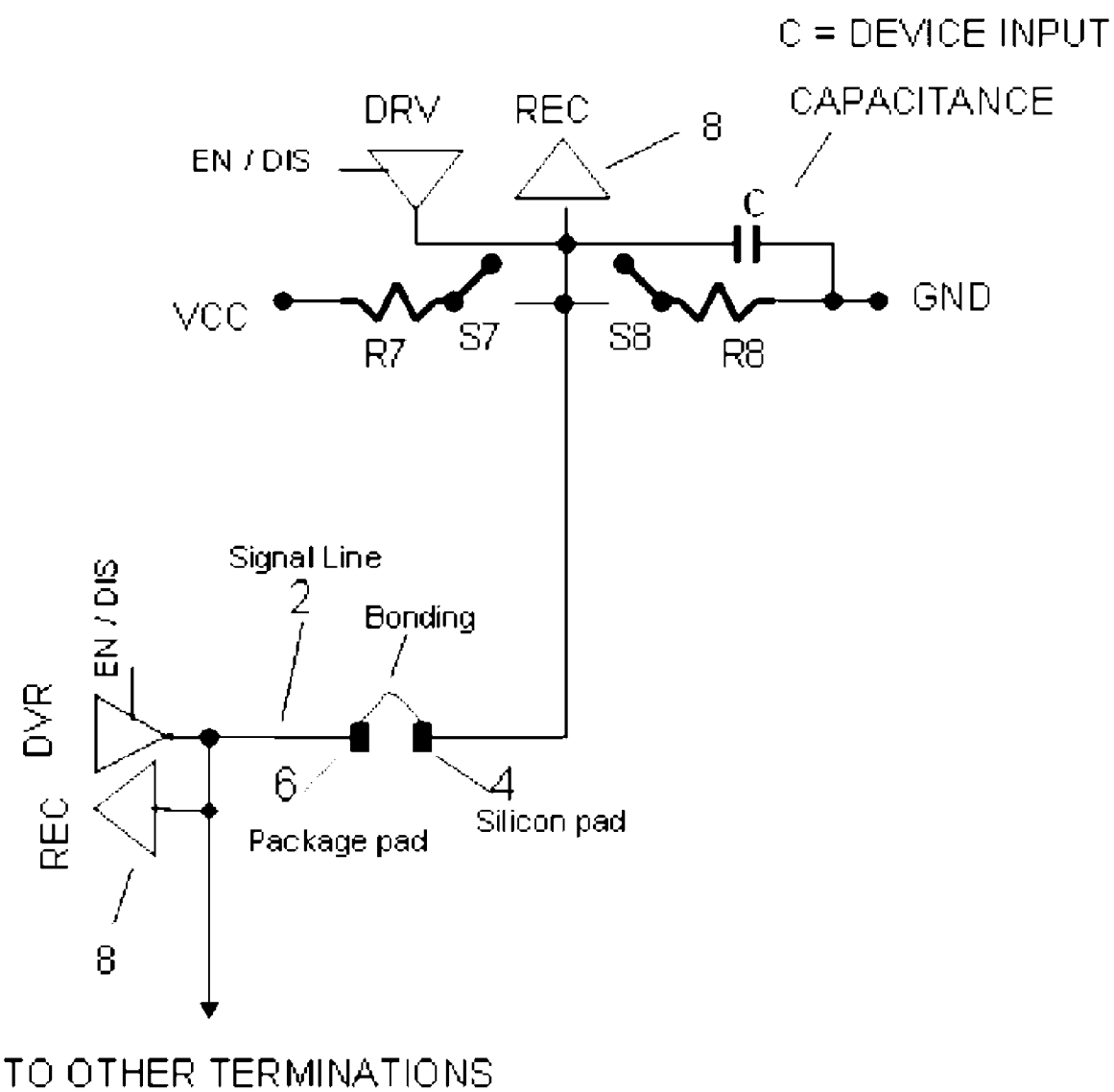
FIG. 1a depicts a prior art termination circuit.

It is well known that a signal traveling on a transmission line will reach the end of the transmission line and it will either be totally dissipated or it will be partially dissipated and partially reflected back to the source. This reflection process will continue until the energy traveling back and forth is totally dissipated, eventually being reduced to zero. This phenomenon happens because the amount of energy originating from the source is not totally used by the receiving load at the other end of the transmission line. In order not to have energy left on the line, the receiving load must be capable of using all of the energy. This means that the receiving load must be equal to the transmitting load. It is referred in the electronics industry as impedance matching.

In electronic circuits with the high speeds and complexities and construction of printed circuit boards, it is quite complex and difficult to obtain these ideal matching impedances. Several reasons contributing to the difficulties. The printed circuit boards cannot be made to correspond to the idea circuit elements of a paper design. System buses are made up of many signal lines, all of which have the characteristics of transmission lines. The signal receiving loads cannot be easily matched to the source loads, all of which contain Capacitive, Inductive and Resistive elements which exist in the connections and the packaging as well as in the silicon elements themselves. Several such loads are often attached to the same transmission line, further increasing the difficulty of impedance matching.

Furthermore, today's circuits operate at very high frequencies. For receiving circuits to operate properly, they need to receive signals of good quality, or high "signal integrity", in terms of transition, duration and amplitude.

When a signal traveling on the transmission line has a short duration, it becomes very difficult to maintain good signal integrity. As the number of loads attached to the same transmission line increases, the lines become less and less capable of handling high frequency signals. Thus, the frequency of the traveling signal wave must be decreased in order for the receiver to receive it and process it properly. When several loads are connected to the same transmission line, the capacitive load increases and the time constant increases. A large time constant requires more time for the signal to stay in its intended value to be recognized by the receiver. At high frequencies, the signal has very short durations, commonly in the nanosecond and sub-nanosecond regions. As a result, the number of receiving loads that can be attached to the same transmission line must be decreases, and it approaches the number one.

To add to the problem, the quality of the signal deteriorates as the quality of the transmission line worsens due to construction variations and variations of terminating loads.

Electronics engineers designing the high frequency systems have adapted several methods to try to make the systems work. The simplest approach has been to construct the shortest line possible between the transmitter and receiver. However, due to the complexity of functions and system requirements in modern circuits, this approach is often not practical. In this description a memory subsystem is described wherein more than one device is attached to the main transmission line in a drop off mode, with terminations which allow good signal integrity at high transmission speeds.

The present computer environment requires that a memory subsystem have both high density and be operated at high speed in order to run complex software. The memory industry, and specifically the Standards body of the industry ("JEDEC®"), works constantly to find ways to cope with the existing problem of density and speed.

The individual memory devices of today are capable of operating at much higher speeds than their predecessors. When these devices are connected to a transmission line, an impedance matching circuit is contained within the memory device and within the controller to which it is attached. One such method is known as internal termination, wherein each signal line is terminated inside the silicon. The entry to the receiver is connected to the center of a resistor divider having one end connected to Vcc and the other to ground. This prior art circuit is shown in FIG. 1a.

Still referring to this prior art circuit, when it is desired to drive a receiver along a transmission line switches s7 and s8 are closed, so that a resistive-capacititive (RC) network is established, having an R value of R7 and R8 in parallel, equal to 150 ohms in this example, and in parallel with capacitor C1. These values are selected to be the characteristic impedance of the transmission line, so that the receiver load is properly terminated. When it is not desired to drive a particular receiver 8 switches S7 and S8 are opened, supposedly creating an infinite impedance. However, this does not happen in practice, and the receiver 8 still presents an impedance to the transmission lines, creating reflecting waves.

When there are a multiple of such memory devices connected in parallel to the same transmission line, the problem of termination becomes more complex. Each line length from the transmission line to the memory device is known as a stub. Terminating all of these stubs to reduce signal reflections is not a simple process. Several problems are associated with said stubs. The termination at the end of each stub presents signal reflections and capacitive load to the main line. Such reflections traveling back and forth make the signal integrity to be unacceptable. In addition when the terminator network is active, it consumes power and makes the device that much hotter.

The capacitive load at each stub end is additive and as such it causes the amplitude of the signal to be small to reliably operate a receiver. The result is that stubs at high frequencies when added together complicate the values of terminator networks. To reduce this effect, the reduction of number of devices that can be attached to the same transmission line becomes necessary. This is a big problem when the present systems have to operate at high speeds requiring high memory densities.

The present invention solves the problem of properly terminating multiple stubs along a transmission line.

The circuit shown in FIG. 1a is that used in the industry and adopted by JEDEC, the standards body. In this circuit a resistive divider is used as a termination, as previously discussed. The values of such resistor terminations are experimentally determined for acceptable signal integrity. However, the capacitive loads added together from all the stubs increase the overall time constant that affects the amplitude of the signal and the reflected signals. In addition, the reflections from the impedance of the receiver and the terminators travels back uninhibited to the main line. All of these reflections result in unacceptable signal degradation.

To state this in another way, the standard prior art approach uses a straight-through connection from the pad of the package to the pad of the silicon and to the center of the termination divider and straight to the internal silicon devices. This approach does nothing to reduce reflections.

Figure 1B:
FIG. 1b depicts a logic table of the present termination circuit.
Figure 1C:
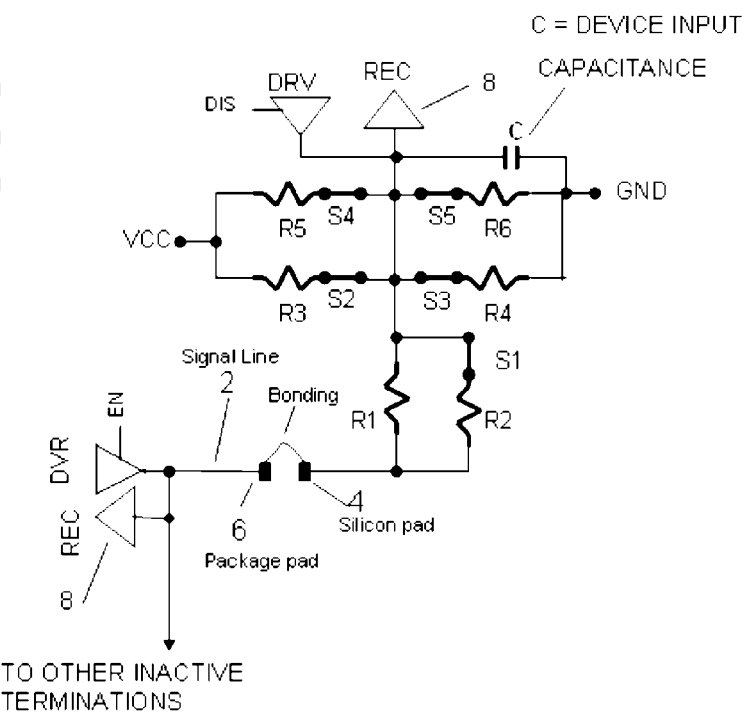
FIG. 1c depicts the present termination circuit in Write Mode.
Figure 1D:
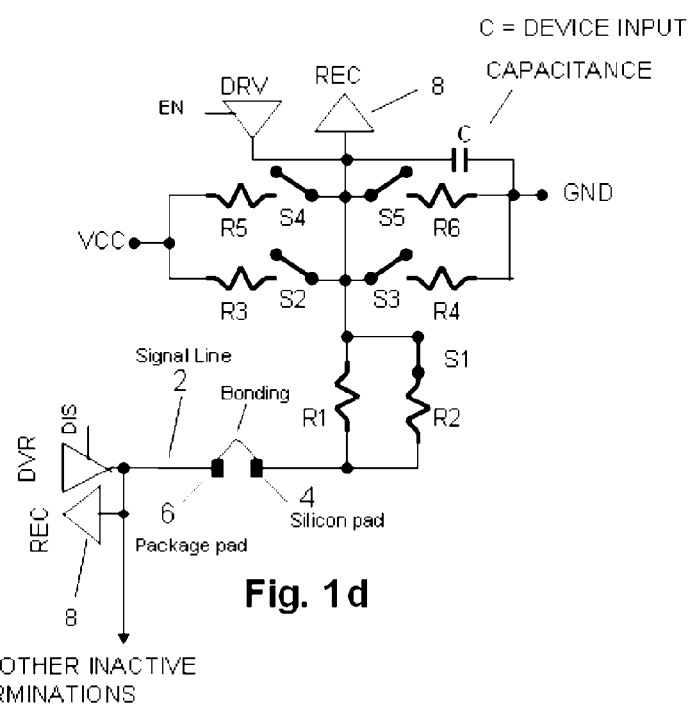
FIG. 1d depicts the present termination circuit in Read Mode.
Figure 1E:
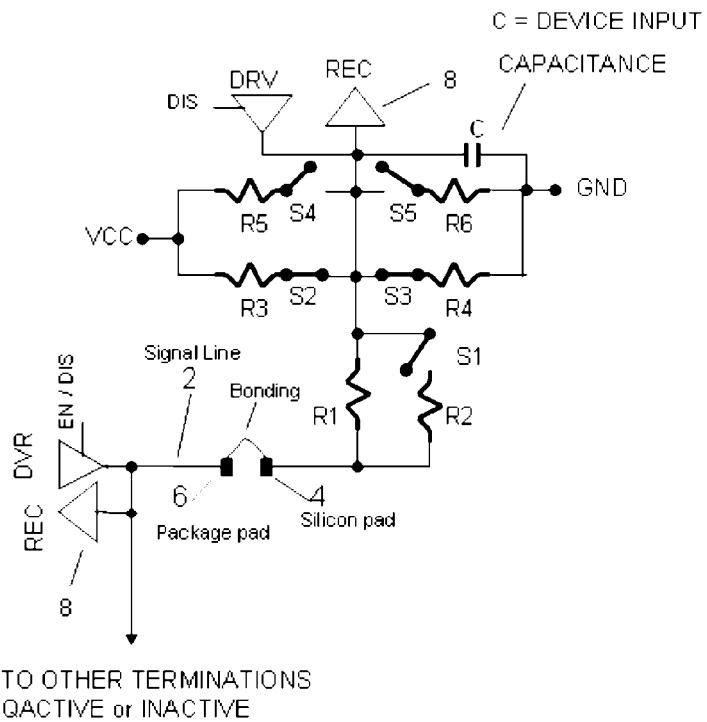
FIG. 1e depicts the present termination circuit in Inactive Mode.

The termination method of the present invention may be understood now by referring to FIGS. 1c, 1d, 1e. These figures disclose a parallel resistor network built on the silicon at the entry of the signal path, before it reaches the internal receiver capacitive load. One side of this network is connected to the silicon entry pad and the other is connected to the resistor divider for the termination as shown. The characteristic impedance of the entry network are chosen carefully, as they must be appropriate for the operation performed. The parallel entry network resistor values are selected for each application to approximate the characteristic impedance of the network.

The component values shown in FIGS. 1c, 1d, and 1e are used as examples, and are not intended to be the only values possible in this invention. For the purpose of this explanation and as a result of simulation and testing done with current circuits, these values appear to be appropriate for multi-drop (having a multitude of stubs) device connections. Other values could be selected for other wiring topologies and for other applications. The effect that these values have will be apparent with the discussion of each function.

These figures show the configuration of the present invention during three different functions. The WRITE function is shown in FIG. 1c, the READ function in FIG. 1d and the INACTIVE function as shown in FIG. 1e, where the termination is neither written to nor being read from, as shown in FIG. 1e. For use in multi-drop memory device connections, in this case memory modules known as DIMM (Dual In line Memory Module), only one function is performed on each module at a time.

Regardless of mode, the circuit of the present invention connects a signal line 2 to a Receiver or Driver 8. The figures show that the signal line 2 terminates at a package pad 6, typically a pad on a printed circuit board. The package pad 6 connects to a silicon pad 4, typically through bonding wire on the silicon device package.

On the other side of the bonding wire, as shown in FIGS. 1a and 1c through 1e is resistor R1 in series with the signal line 2. Resistor R2 is in series with electronic switch S1, and the R2-S1 circuit is in parallel with R1. S1 may be opened or closed, depending upon the desired mode. Circuitry, not shown, is provided to open or close this switch automatically when the mode is switched. All the other switches of this circuit are controlled in a similar manner.

A complex resistor bridge is connected between Vcc (power) and GND (ground), in these figures. Resistor R5 is in series with switch S4, and resistor R3 is in series with switch S2. Resistor R6 is in series with switch S5, and resistor R4 is in series with switch S3. As in the prior art version, capacitor C connects the signal line to GND.

For the WRITE function of the selected device, as shown in FIG. 1c, all of the switches are closed. The overall series input resistance of the network is the parallel combination of resistors R1 and R2. That small resistance slows down the signal by increasing the rise and fall time of the signal traveling to the input of the receiver 8. This slight reduction in speed produces fewer disturbances in the quality of the signal. The termination divider comprised of resistors R3 and R4, R5 and R6 is selected to minimize the reflections and reduce power consumption. The result is that for the application designed the signal reaches the receiver 8 with acceptable integrity and amplitude.

Since there are more devices attached to the same line and they are not selected, they are inactive and are configured as shown in FIG. 1e.

The device in inactive mode has the switches S2 and S3 closed and S1, S4 and S5 open as shown in the figure. This combination applies higher resistance values for the termination and thus reduces power consumption. The value of R3 and R4 are selected for the application. When switch S1 is open a high resistance is inserted in series with the signal. The high input resistance R1 with the associated internal capacitive load causes a large time constant. It also isolates the internal capacitive load from the main line. As a result the selected device overall capacitive load time constant is smaller and it is affected mainly by the selected device. This allows the amplitude of the signal to reach acceptable value and integrity at the receiver of the selected device. The inactive capacitive load is not directly added to the selected device capacitive load. The reflection from the receiver of the inactive device is further attenuated by the high value of the series resistor and as such it has a very small effect in the integrity of the signal.

The READ mode operation is shown in FIG. 1d. In this mode only S1 is closed and all other switches are open. The parallel combination of R1 and R2 reduces the overall resistance of the path and the signal traveling from inside the selected driver, the source, to the transmission line has a smoother transition and better impedance control of the main line. The effect is a better quality signal at the selected receiver 8 at the other end of the line. The small series equivalent resistance adds to the damping factor of the signal.

The Activation tables which are shown in FIG. 1b show the combination of the switches for each operation.

While the invention has been described with reference to specific embodiments, it will be apparent that improvements and modifications may be made within the purview of the invention without departing from the scope of the invention defined in the appended claims.

What is claimed is:

1. A circuit for terminating devices attached to a signal line and driving a receiver or driver, the circuit comprising:
    (a) a resistor R1 in series with the signal line;
    (b) a circuit CR1 comprising a resistor r2 in series with a switch s1, wherein CR1 is in parallel with R1;
    (c) a circuit CR2 comprising a resistor R3 in series with switch S2, connected at one end to Vcc and at the other end to the receiver or driver;
    (d) a circuit CR3 comprising a resistor R5 in series with switch S4, connected at one end to Vcc and at the other end to the receiver or driver;
    (e) a circuit CR4 comprising a resistor R6 in series with switch S5, connected at one end to GND and at the other end to the receiver or driver;

(f) a circuit CR5 comprising a resistor R4 in series with switch S3, connected at one end to ground and at the other end to the receiver or driver; and (g) a capacitor connected between the receiver or transmitter and ground.

2. The circuit of claim 1, configured in Write mode, wherein:

(a) switch S1 is ON;
(b) switch S2 is ON;
(c) switch S3 is ON;
(d) switch S4 is ON; and
(e) switch S5 is ON.

3. The circuit of claim 1, configured in Read mode, wherein:

(a) switch S1 is ON;
(b) switch S1 is OFF;
(c) switch S1 is OFF;
(d) switch S1 is OFF; and
(e) switch S1 is OFF.

4. The circuit of claim 1, configured in Inactive mode, wherein:

(a) switch S1 is OFF;
(b) switch S1 is ON;
(c) switch S1 is ON;
(d) switch S1 is OFF; and
(e) switch S1 is OFF.

* * * * *